United States Patent
Bao et al.

(10) Patent No.: US 10,205,002 B2
(45) Date of Patent: Feb. 12, 2019

(54) METHOD OF EPITAXIAL GROWTH SHAPE CONTROL FOR CMOS APPLICATIONS

(71) Applicant: Applied Materials, Inc., Santa Clara, CA (US)

(72) Inventors: Xinyu Bao, Fremont, CA (US); Chun Yan, San Jose, CA (US); Errol Antonio C. Sanchez, Tracy, CA (US); Hua Chung, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 191 days.

(21) Appl. No.: 15/418,128

(22) Filed: Jan. 27, 2017

(65) Prior Publication Data
US 2018/0033872 A1    Feb. 1, 2018

Related U.S. Application Data

(60) Provisional application No. 62/366,906, filed on Jul. 26, 2016.

(51) Int. Cl.
*C23C 16/455* (2006.01)
*C30B 25/02* (2006.01)
(Continued)

(52) U.S. Cl.
CPC .. *H01L 29/66795* (2013.01); *C23C 16/45523* (2013.01); *C23C 16/45525* (2013.01); *C30B 25/025* (2013.01); *C30B 25/04* (2013.01); *C30B 25/165* (2013.01); *C30B 25/186* (2013.01); *H01L 21/0243* (2013.01); *H01L 21/0262* (2013.01); *H01L 21/02381* (2013.01); *H01L 21/02433* (2013.01); *H01L 21/02532* (2013.01);
(Continued)

(58) Field of Classification Search
None
See application file for complete search history.

(56) References Cited

U.S. PATENT DOCUMENTS 6,506,618 B1 * 1/2003 Kizuki ............... C30B 23/02
257/E21.108
8,263,451 B2    9/2012 Su et al.
(Continued)

OTHER PUBLICATIONS

C. R. Wang, B. H. Muller, E. Bugiel and K. R. Hofmann, "Fabrication of resonant-tunneling diodes by Sb surfactant modified growth of Si films on CaF/sub 2//Si," in IEEE Transactions on Nanotechnology, vol. 2, No. 4, pp. 236-240, Dec. 2003.*
(Continued)

*Primary Examiner* — Phat X Cao
*Assistant Examiner* — Diana C Vieira
(74) *Attorney, Agent, or Firm* — Patterson + Sheridan LLP

(57) ABSTRACT

The present disclosure generally relate to methods of processing a substrate in an epitaxy chamber. The method includes exposing a substrate having one or more fins to a group IV-containing precursor and a surfactant containing antimony to form an epitaxial film over sidewalls of the one or more fin structures, wherein the surfactant containing antimony is introduced into the epitaxy chamber before epitaxial growth of the epitaxial film, and a molar ratio of the surfactant containing antimony to the group IV-containing precursor is about 0.0001 to about 10.

19 Claims, 3 Drawing Sheets

(51) Int. Cl.
*C30B 25/04* (2006.01)
*C30B 25/16* (2006.01)
*C30B 25/18* (2006.01)
*H01L 21/02* (2006.01)
*H01L 21/24* (2006.01)
*H01L 21/762* (2006.01)
*H01L 29/04* (2006.01)
*H01L 29/08* (2006.01)
*H01L 29/66* (2006.01)
*H01L 29/78* (2006.01)

(52) U.S. Cl.
CPC .. *H01L 21/02576* (2013.01); *H01L 21/02579* (2013.01); *H01L 21/02598* (2013.01); *H01L 21/02609* (2013.01); *H01L 21/02639* (2013.01); *H01L 21/02658* (2013.01); *H01L 21/24* (2013.01); *H01L 21/76224* (2013.01); *H01L 29/045* (2013.01); *H01L 29/0847* (2013.01); *H01L 29/785* (2013.01); *H01L 29/7848* (2013.01); *H01L 29/7853* (2013.01); *H01L 29/7851* (2013.01)

(56) References Cited

U.S. PATENT DOCUMENTS 8,394,712 B2 * 3/2013 Dube ............... H01L 29/66628
257/77
8,440,517 B2 5/2013 Lin et al.
9,666,581 B2 * 5/2017 Ching ............... H01L 21/02532

OTHER PUBLICATIONS

Wietler, Tobias & Schmidt, Jan & Tetzlaff, Dominic & Bugiel, E. (2014). Surfactant-mediated epitaxy of silicon germanium films on silicon (001) substrates. Thin Solid Films. 557. 27-30. 10.1016/j.tsf.2013.08.125.*

C Y Fong et al. 2002 Modelling Simul. Mater. Sci. Eng. 101 R61.*

Voigtländer, Bert & Zinner, Andre & Weber, Thomas & P. Bonzel, Hans. (1995). Modification of growth kinetics in surfactant-mediated epitaxy. Physical review. B, Condensed matter. 51. 7583-7591. 10.1103/PhysRevB.51.7583.*

S.W. Jun et al.; Isoelectronic surfactant-induced surface step structure and correlation with ordering in GaInP; Journal of Crystal Growth, vol. 235, Issues 1-4, Feb. 2002, pp. 15-24.

T. Kikkawa et al.; Ordered-InGaPSB/GaAs-based FET and HBT structures grown by MOVPE; 2001 International Conference on Induium Phosphide and Related Materials Conference Proceedings; 13th IPRM May 14-18, 2001 Nara, Japan.

R. T. Lee et al; Surfactant controlled growth of GaInP by organometallic vapor phase epitaxy; Journal of Applied Physics vol. 87, No. 8, Apr. 15, 2000 pp. 3730-3735.

J.K. Shurtleff et al; Time dependent surfactant effects on growth of GaInP heterostructures by organometallic vapor phase epitaxy; Journal of Crystal Growth 234 (2002) pp. 327-336.

* cited by examiner

METHOD OF EPITAXIAL GROWTH SHAPE CONTROL FOR CMOS APPLICATIONS

CROSS-REFERENCE TO RELATED APPLICATIONS

This application claims priority to U.S. provisional patent application Ser. No. 62/366,906, filed Jul. 26, 2016, which is herein incorporated by reference.

FIELD

Implementations of the disclosure generally relate to the field of semiconductor manufacturing processes, and more particularly to methods for forming transistors.

BACKGROUND

As circuit densities increase for next generation devices, the widths of interconnects, such as vias, trenches, contacts, gate structures and other features, as well as the dielectric materials therebetween, decrease to 22 nm or smaller dimensions, whereas the thickness of the dielectric layers remain substantially constant, with the result of increasing the aspect ratios of the features. Recently, complementary metal oxide semiconductor (CMOS) FinFET devices have been introduced into many logic and other applications and are integrated into various different types of semiconductor devices.

FinFET devices typically include semiconductor fins with high aspect ratios in which the channel and source/drain regions for the transistor are formed thereover. A gate electrode is then formed over and along side of a portion of the fin devices utilizing the advantage of the increased surface area of the channel and source/drain regions to produce faster, more reliable and better-controlled semiconductor transistor devices. Further advantages of FinFETs include reducing the short channel effect and providing higher current flow.

With the continuous scaling and architecture advancement, it has been a challenge to land the source/drain contact plug directly onto very narrow fins in the FinFET devices. Epitaxial layers have been used to increase the volume for better contact. The typical Si epitaxial film is faceted by $\{111\}$ planes and has a diamond shape when it is observed along the transistor channel direction due to lower growth rate on <111> direction than <100> and <110> directions. The epitaxial film with dominant $\{111\}$ facets may be disadvantageous because the lateral growth on the sidewall of the fin prohibits further distance reduction of neighboring fins. In addition, when the device has multi-fin FinFETs, voids can be formed in the merged source or drain due to the diamond shape.

Therefore, there is a need for an improved method to modify the growth rate for different crystal planes of epitaxial film in semiconductor devices.

SUMMARY

The present disclosure generally relate to methods of processing a substrate in an epitaxy chamber. In one implementation, a method includes exposing a substrate having one or more fins to a group IV-containing precursor and a surfactant containing antimony to form an epitaxial film over sidewalls of the one or more fin structures, wherein the surfactant containing antimony is introduced into the epitaxy chamber before epitaxial growth of the epitaxial film, and a molar ratio of the surfactant containing antimony to the group IV-containing precursor is about 0.0001 to about 10.

In another implementation, a method includes forming one or more trenches in a substrate to define fin structures extending from a surface of the substrate, filling the one or more trenches with an insulator material, and growing an epitaxial film over sidewalls of each fin structure, wherein the epitaxial film has $\{100\}$ planes, $\{110\}$ planes, and $\{111\}$ planes, by exposing the substrate to a group IV-containing precursor and a surfactant comprising a group V-containing precursor, wherein the surfactant is introduced into the processing chamber before epitaxial growth of the epitaxial film such that growth rate of the epitaxial film on $\{111\}$ planes is faster than growth rate of the epitaxial film on $\{100\}$ planes.

In yet another implementation, a method includes forming one or more trenches in a substrate to define fin structures extending from a surface of the substrate, filling the one or more trenches with an insulator material, and growing an epitaxial film over sidewalls of each fin structure, wherein the epitaxial film has $\{100\}$ planes, $\{110\}$ planes, and $\{111\}$ planes, by exposing the substrate to a group IV-containing precursor and a surfactant comprising a group V-containing precursor, wherein exposing the substrate to a group IV-containing precursor and a surfactant comprising introducing a single pulse of the surfactant into the processing chamber before introduction of the group IV-containing precursor, wherein the surfactant is introduced into the processing chamber before epitaxial growth of the epitaxial film such that growth rate of the epitaxial film on $\{111\}$ planes is faster than growth rate of the epitaxial film on $\{100\}$ planes, and while flowing the surfactant, introducing the group IV-containing precursor into the processing chamber.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
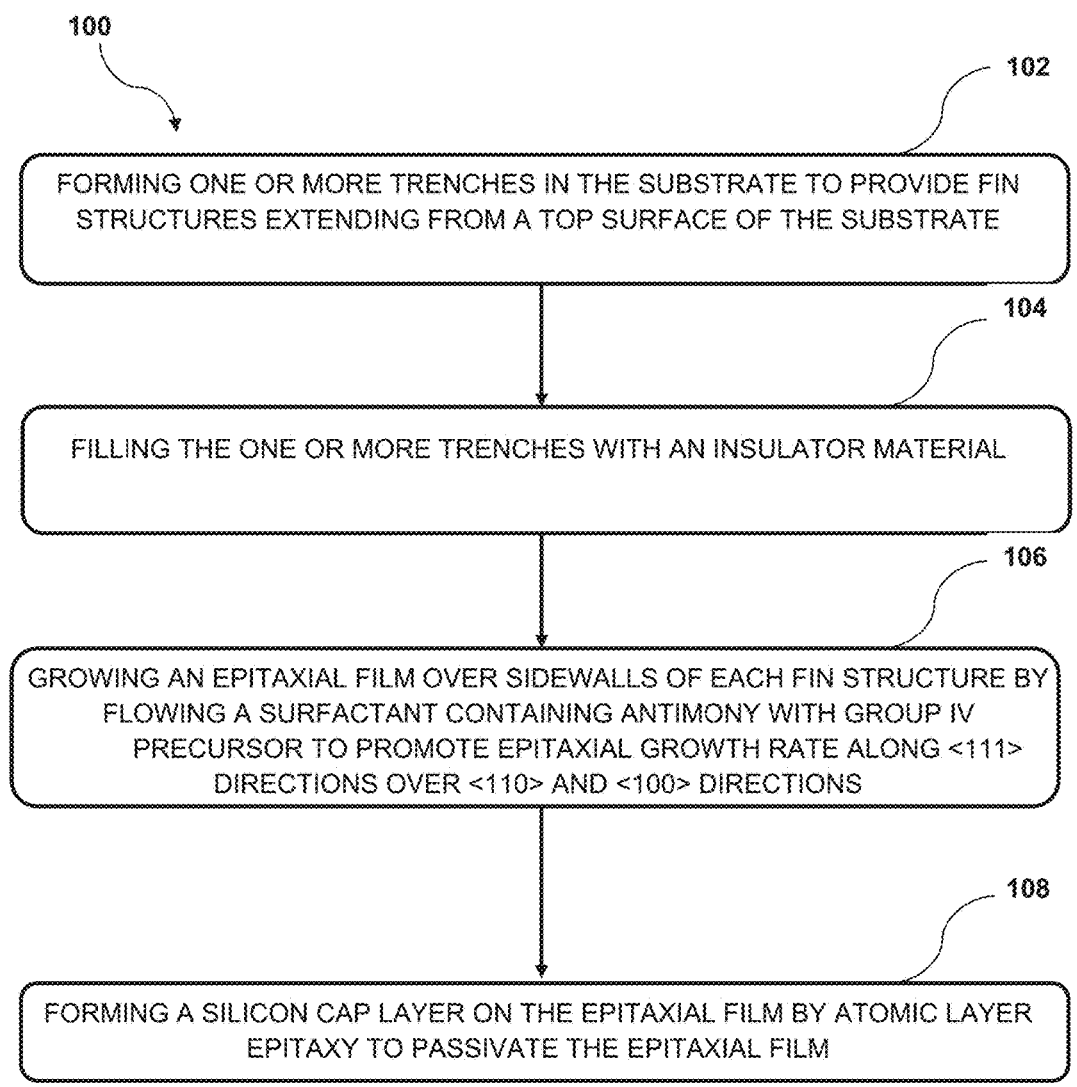
FIG. 1 is a flow chart illustrating an exemplary method for manufacturing semiconductor structure according to implementations of the disclosure.

To facilitate understanding, identical reference numerals have been used, where possible, to designate identical elements that are common to the figures. The figures are not drawn to scale and may be simplified for clarity. It is contemplated that elements and features of one implementation may be beneficially incorporated in other implementations without further recitation.

DETAILED DESCRIPTION

Figure 2A:
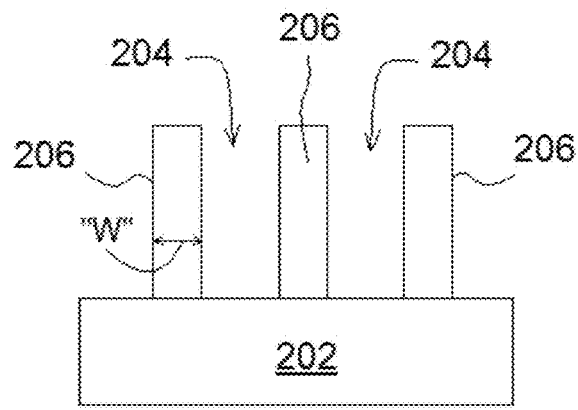
FIGS. 2A to 2C illustrate cross-sectional views of a simplified semiconductor structure during certain stages of fabrication according to the flow chart of FIG. 1.
Figure 2B:
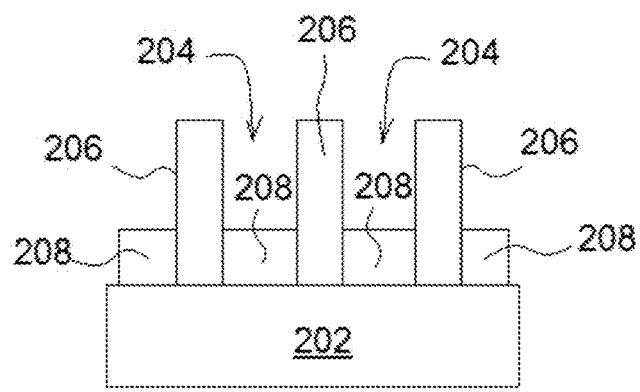
Figure 2C:
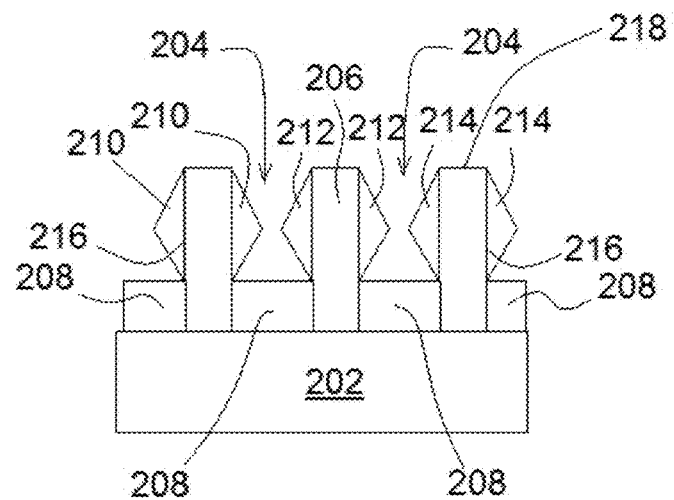

FIG. 1 is a flow chart illustrating an exemplary method for manufacturing semiconductor structure according to implementations of the disclosure. FIGS. 2A to 2C illustrate cross-sectional views of a simplified semiconductor structure during certain stages of fabrication according to the flow chart of FIG. 1. Those skilled in the art will further recognize that the full process for forming a semiconductor device and the associated structures are not illustrated in the drawings or described herein. Instead, for simplicity and clarity, only so much of a process for forming a semiconductor device and the associated structures as is unique to the present disclosure or necessary for an understanding of the present disclosure is depicted and described. In addition, although various steps are illustrated in the drawings and described herein, no limitation regarding the order of such steps or the presence or absence of intervening steps is implied. Steps depicted or described as sequential are, unless explicitly specified, merely done so for purposes of explanation without precluding the possibility that the respective steps are actually performed in concurrent or overlapping manner, at least partially if not entirely.

The method 100 begins at block 102 by etching a substrate 202 to provide one or more trenches 204 in the substrate 202, as shown in FIG. 2A. The formation of the trenches 204 results in the substrate 202 with two or more fin structures 206. While three fin structures 206 are shown, it is contemplated that the substrate may be etched to provide more or less fin structures depending on the application. The trench 204 may have a high aspect ratio. The ratio of trench height to trench width (i.e., the aspect ratio) may be greater than 20 to 1, 18 to 1, 16 to 1, 14 to 1, 12 to 1, 10 to 1, 9 to 1, 8 to 1, 7 to 1, 6 to 1, 5 to 1, 4 to 1, 3 to 1, or 2 to 1, for instance. The trenches 204 may have a generally rectangular cross-section as shown or a cross-section with some other shape. The trenches 204 may have a generally constant cross-sectional profile along at least a portion of its length, such as through one, two, four, or more transistor lengths. In various implementations, the trenches 204 may have a width "W" of about 3 nm to about 10 nm, for example about 5 nm to about 7 nm.

The term "substrate" used herein is intended to broadly cover any object that can be processed in a process chamber. For example, the substrate 202 may be any substrate capable of having material deposited thereon, such as a silicon substrate, for example silicon (doped or undoped), crystalline silicon (e.g., Si <100> or Si <111>), silicon oxide, strained silicon, doped or undoped polysilicon, or the like, germanium, a III-V compound substrate, a silicon germanium (SiGe) substrate, a silicon germanium carbide (SiGeC) substrate, a silicon germanium oxide (SiGeO) substrate, a silicon germanium oxynitride (SiGeON) substrate, a silicon carbide (SiC) substrate, a silicon carbonitride (SiCN) substrate, a silicon carbonoxide (SiCO), an epi substrate, a silicon-on-insulator (SOI) substrate, a carbon doped oxide, a silicon nitride, a display substrate such as a liquid crystal display (LCD), a plasma display, an electro luminescence (EL) lamp display, a solar array, solar panel, a light emitting diode (LED) substrate, a patterned or non-patterned semiconductor wafer, glass, sapphire, or any other materials such as metals, metal alloys, and other conductive materials. In one exemplary implementation, the substrate 202 is a monocrystalline silicon-containing substrate.

At block 104, the trenches 204 are filled with an insulator material 208. The insulator material 208 may be deposited using any suitable deposition process, such as a chemical vapor deposition (CVD) process, which may be plasma enhanced. The insulator material 208 may be a shallow trench isolation (STI) oxide, which may include silicon oxide (SiO), silicon dioxide ($SiO_2$), silicon nitride (SiN), silicon carbonitride (SICN), silicon oxynitride (SiON), aluminum oxide, or other suitable dielectric materials or high-k dielectric materials. The insulator material 208 is then polished and/or etched back to a desired depth within the trenches 204, as shown in FIG. 2B. For sub-10 nm node FinFETs, the depth may be between about 30 nm and about 400 nm from a top surface 218 of the trench 204. Alternatively, the trenches 204 may be partially filled with the insulator material 208 to a desired height.

At block 106, an epitaxial film 210, 212, 214 is grown over sidewalls 216 of each fin structure 206 using an inventive epitaxy process. The epitaxial film 210, 212, 214 may serve as, or be part of a source or drain region. In some cases, the epitaxial film 210, 212, 214 may enclose or cover the exposed surfaces of the trenches 204. The epitaxial film 210, 212, 214 may include doped or undoped group IV-containing material such as Si, Ge, Si:P, SiGe, SiC, SiAs, SiGe:B, Si:CP, any suitable semiconductor materials or compound semiconductor materials such as III-V materials, or other suitable materials that may be used as a source or drain region or used as a stressor film to improve transistor performance. In one implementation, the epitaxial film 210, 212, 214 includes Si material. In another implementation, the epitaxial film 210, 212, 214 includes SiGe material. In some applications where high concentration of germanium is required, for example pMOS source and drain materials used in conductive nodes advancing 7 nm and beyond, the concentration of germanium in the silicon may be above about 30% or more, for example about 45% or more, such as about 70% to about 100%.

The present inventors have discovered a new approach to modify the shape of an epitaxial layer. Specifically, the inventors found that antimony (Sb) can be used as an effective surfactant during an epitaxy process for changing the growth rate on different crystal planes for an epitaxial film. In one implementation where the epitaxial film 210, 212, 214 includes group IV material such as Si, the substrate 202 or at least the trenches 204 are exposed to a silicon-containing precursor and an antimony-containing precursor. While Sb is discussed in this disclosure as a surfactant for epitaxy process, it is contemplated that other group V element such as As may also be used for shape control of the epitaxy layer The epitaxial film 210, 212, 214 may include surfaces having (100) plane, (111) plane, and (110) plane. With the presence of Sb during epitaxial growth of silicon, the {111} planes are found to have the fastest growth rate compared to the {110} planes and {100} planes, while the {100} planes are found to have the slowest growth rate for the epitaxial silicon films. Therefore, the epitaxial silicon growth rate along <111> directions are faster than <110> and <100> directions, resulting in the {100} plane growth suppressed. If the substrate 202 or the trenches 204 is exposed to a mixture of precursors without the presence of Sb, the growth rate on {100} and {110} planes is found to be faster than {111} planes.

In various implementations, the growth rate difference between {111} planes and {100} planes could be as large as about 20% or more, about 30% or more, about 40% or more, about 50% or more, about 60% or more, about 70% or more, about 80% or more, or about 90% or more, such as about 95%. The epitaxial silicon layer inside the trenches 204 is grown into a V-shaped structure having exposed (111) planes after a certain period of time, as shown in FIG. 2C. This is because the epitaxial silicon growth is dominated on <111> direction, while the epitaxial silicon growth on the top surface 218 of the fin structures 206 and the bottom surface of the trenches 204 are at a slower rate or suppressed. The {100} planes at a slower growth rate finally disappear, resulting in a V-shaped structure having an exposed {111} planes. When epitaxial silicon growth is dominated on <111> direction, no visible stacking faults are observed. The defects that would have occurred due competing facets, stacking faults, mixed grain boundaries, or different crystallographic orientations associated with other crystal planes (e.g., {100} planes) is significantly minimized. As a result, the epitaxial film 210, 212, 214 can be grown over the sidewalls 216 of each fin structure 206 defect free. The resulting epitaxial film 210, 212, 214 is a Sb doped silicon layer (SiSb) layer or silicon antimony alloy that is defect free.

It should be understood by those skilled in the art that the plane, direction, and family of the planes/directions used in this disclosure generally follow Miller notation system. For example, plane (100), plane (010), plane (001) belong to a family of {100} planes, and cubic edge directions [100], [010], [001], [0$\bar{1}$0], [00$\bar{1}$], [$\bar{1}$00] belong to a family of <100> directions.

Suitable silicon-containing precursors may be non-carbon silicon source gases or carbon-containing silicon source gases. For example, the silicon-containing precursors may be silanes, halogenated silanes, organosilanes, or any combinations thereof. Silanes may include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$), or other higher order silanes such as polychlorosilane. Halogenated silanes may include compounds with the empirical formula $X'_ySi_xH_{(2x+2-y)}$, where $X'$=F, Cl, Br or I, such as hexachlorodisilane ($Si_2Cl_6$), tetrachlorosilane ($SiCl_4$), dichlorosilane ($Cl_2SiH_2$) and trichlorosilane ($Cl_3SiH$). Organosilanes may include compounds with the empirical formula $R_ySi_xH_{(2x+2-y)}$, where R=methyl, ethyl, propyl or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$) and hexamethyldisilane (($CH_3$)$_6Si_2$).

It has been observed that when higher order silanes (e.g., $Si_2H_6$ or above) is applied to grow epitaxial film 210, 212, 214 at low temperature, for example, a temperature of about 800 degrees Celsius or below, such as about 250 degrees Celsius to about 625 degrees Celsius, there is a very high tendency of defective growth on {110} planes. Sb has been observed to suppress Si or SiGe growth on (110) plane and improve the epitaxial quality in many of low temperature epitaxy applications.

Suitable antimony-containing precursors may be non-carbon antimony source gases or carbon-containing antimony source gases. The use of carbon-containing antimony source gases adds additional carbon to the epitaxial film to provide additional stress or diffusion block. In various implementations, the antimony-containing precursor may include stibine ($SbH_3$), antimony trichloride ($SbCl_3$), antimony tetrachloride ($SbCl_4$), antimony pentachloride ($SbCl_5$), triphenylantimony (($C_6H_5$)$_3Sb$), antimony trihydide ($SbH_3$), antimonytrioxide ($Sb_2O_3$), antimony pentoxide ($Sb_2O_5$), antimony trifluoride ($SbF_3$), antimony tribromide ($SbBr_3$), antimonytriiodide ($SbI_3$), antimony pentafluoride ($SbF_5$), Triethyl antimony (TESb) and trimethyl antimony (TMSb).

In one exemplary implementation, the silicon-containing precursor is trichlorosilane ($Cl_3SiH$, TCS), and the antimony-containing precursor is trimethyl antimony (TMSb).

If desired, one or more dopant gases may be introduced into the processing chamber to provide the epitaxial layer with desired conductive characteristic and various electric characteristics, such as directional electron flow in a controlled and desired pathway required by the electronic device. Exemplary dopant gas may include, but are not limited to phosphorous, boron, gallium, or aluminum, depending upon the desired conductive characteristic of the deposited epitaxial layer.

Figure 3A:
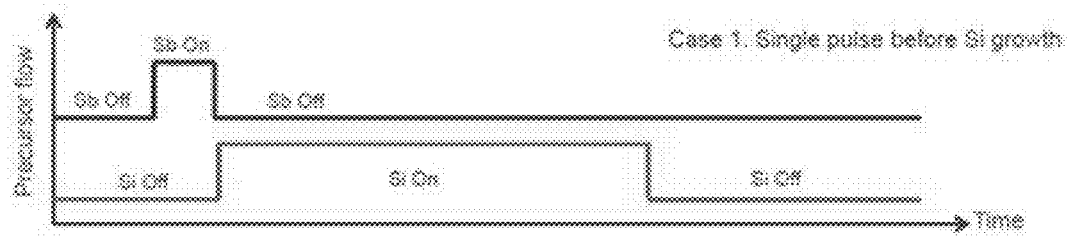
FIGS. 3A to 3C illustrate different flow schemes for forming an epitaxial layer according to implementations of the present disclosure.

Any one or more of the antimony-containing precursors discussed above may be co-flowed into an epitaxy chamber with any one or more of the silicon-containing precursors discussed above. The antimony-containing precursor may be flowed continuously throughout the entire epitaxy process, or flowed a certain period of time at certain stages before or during the epitaxy process. In one implementation, a single pulse flow of the antimony-containing precursor may be introduced into the epitaxy chamber before the introduction of the silicon-containing precursor (i.e., before Si growth). The flow of the antimony-containing precursor may be turned off once the silicon-containing precursor has introduced into the epitaxy chamber, as shown in FIG. 3A.

Figure 3B:
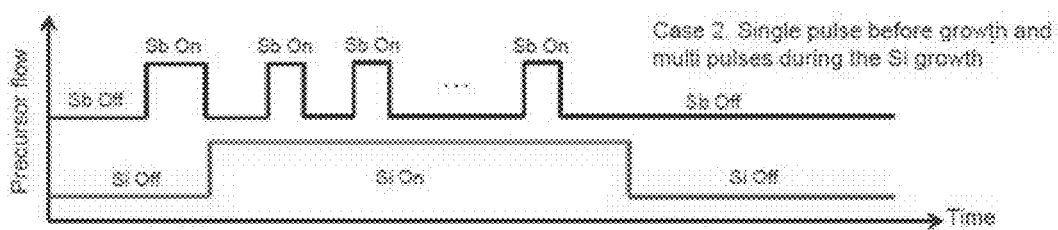
Figure 3C:
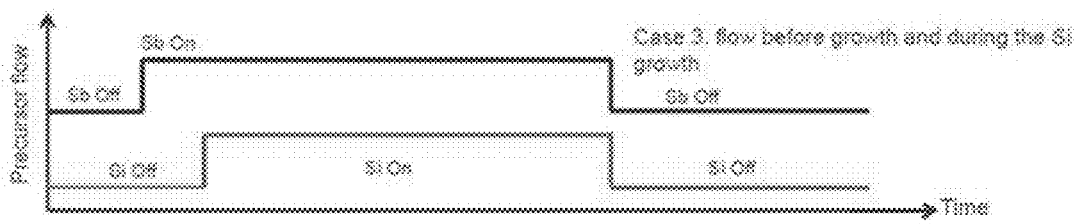

In some implementations, a single pulse of the antimony-containing precursor may be introduced into the epitaxy chamber before the introduction of the silicon-containing precursor (i.e., before Si growth). Once the silicon-containing precursor has been introduced into the epitaxy chamber (i.e., during Si growth), multiple pulses of the antimony-containing precursor may be introduced into the epitaxy chamber at predetermined time intervals, as shown in FIG. 3B. The multiple pulse of the antimony-containing precursor may be turned off prior to turning off the silicon-containing precursor.

In some implementations, the antimony-containing precursor may be introduced into the epitaxy chamber before the introduction of the silicon-containing precursor (i.e., before Si growth). While flowing of the antimony-containing precursor, introducing the silicon-containing precursor into the epitaxy chamber. The antimony-containing precursor and the silicon-containing precursor may be both turned off once the desired thickness or shape of the epitaxial film has obtained.

In any of the flow scheme discussed herein, the input Sb/Si molar ratio may be about 0.0001 to about 10, for example about 0.001 to about 5, such as about 0.01 to about 1. During the epitaxy process, the temperature within the epitaxy chamber may be maintained at about 250 degrees Celsius to about 800 degrees Celsius, for example about 300 degrees Celsius to about 650 degrees Celsius, such as about 450 degrees Celsius to about 525 degrees Celsius. The pressure within the epitaxy chamber may be maintained at about 1 Torr or greater, for example, about 10 Torr to about 40 Torr or greater, such as about 150 Torr to about 600 Torr. It is contemplated that pressures greater than about 600 Torr may be utilized when low pressure deposition chambers are not employed.

For source/drain growth on fin structures 206, the fin structures 206 may be pre-cleaned to remove native oxide before transferring to an epitaxy chamber for growth of epitaxial film 210, 212, 214. The antimony-containing precursor may be introduced before or at the same time with the group IV precursor such as silicon-containing precursor in the above-mentioned example to promote {111} plane growth. The shape and thickness of the epitaxial film 210, 212, 214 can be tuned to achieve conformal growth on the fin structures 206 by controlling the Sb and IV flow and growth time.

For source/drain growth from source/drain wells, the source/drain wells may be pre-cleaned to remove native oxide before transferring to an epitaxy chamber for growth of epitaxial film 210, 212, 214. The antimony-containing precursor may be introduced before or at the same time with group IV precursors. It changes growth mainly along <111> directions and reduces defects due to less competing facets. When the growth reaches out of the source/drain wells, the flow of the antimony-containing precursor can be stopped or kept depending on the shape required above the source/drain wells.

At block 108, once the epitaxial film 210, 212, 214 with a desired shape or thickness have been grown over sidewalls 216 of each fin structure 206, that is, each epitaxial film 210, 212, 214 has a peaked shape, and a maximum thickness near a middle of the fin sidewalls 216 and declining to zero at the exposed extremities of the fin sidewalls 216, the substrate 202 may be subjected to additional processes to form a general structure of a semiconductor device. For example, portions on opposing sides of the epitaxial film 210 may be optionally removed to increase the distance between the epitaxial film 210 on a fin structure 206 and an epitaxial film 212 grown on an adjacent fin structure 206. Thereafter, a silicon cap layer may be conformally formed on the epitaxial film 210, 212, 214, respectively, by an atomic layer epitaxy process to passivate the epitaxial film 210, 212, 214 so that the subsequent layers, for example a gate dielectric (such as silicon dioxides, carbon doped silicon oxides, silicon germanium oxides, or high-k dielectric materials), can be easily formed over a portion of the fin structure 206. A gate electrode is then formed over and alongside of a portion of the fin structure 206 to form a general structure of the FinFET.

While the present disclosure uses silicon as an example for the epitaxial film, it is contemplated that the concept described in implementations of the present disclosure is also applicable to other materials that may be used in logic and memory applications. Some exemplary materials for the epitaxial film may include, but are not limited to SiGeAs, Ge, GeP, SiGeP, SiGeB, Si:CP, GeSn, GeP, GeB, or GeSnB. If a germanium-containing layer is desired, a gas mixture comprising a germanium-containing precursor may be introduced into the processing chamber. In such a case, the gas mixture may contain the silicon-containing precursor and the antimony-containing precursor discussed above. Suitable germanium-containing precursor may include, but is not limited to germane ($GeH_4$), digermane ($Ge_2H_6$), trigermane ($Ge_3H_8$), chlorinated germane gas such as germanium tetrachloride ($GeCl_4$), dichlorogermane ($GeH_2Cl_2$), trichlorogermane ($GeHCl_3$), hexachloro-digermane ($Ge_2Cl_6$), or a combination of any two or more thereof. Any suitable halogenated germanium compounds may also be used. In one exemplary implementation, digermane ($Ge_2H_6$) is used.

Benefits of the present disclosure include a shape growth control of epitaxial films by co-flowing a group IV precursor and an antimony-containing precursor during an epitaxial process. Co-flowing the antimony-containing precursor and the group IV precursor promote epitaxial silicon growth rate along <111> directions over <110> and <100> directions. No visible stacking faults are observed when epitaxial silicon growth is dominated on <111> direction. The defects that would have occurred due to stacking faults, mixed grain boundaries, or different crystallographic orientations associated with other crystal planes (i.e., {100} and {110} planes) is significantly minimized. As a result, the epitaxial film can be grown defects free. The defect-free epitaxial film allows for better growth of subsequent gate dielectrics, resulting in superior integration and surface morphology of the epitaxial material for FinFETs.

While the foregoing is directed to implementations of the present disclosure, other and further implementations of the disclosure may be devised without departing from the basic scope thereof.

The invention claimed is:

1. A method of processing a substrate in an epitaxy chamber, comprising:
exposing a substrate having one or more fins to a group IV-containing precursor and a surfactant containing antimony to form an epitaxial film over sidewalls of the one or more fin structures, wherein the surfactant containing antimony is introduced into the epitaxy chamber before epitaxial growth of the epitaxial film, and a molar ratio of the surfactant containing antimony to the group IV-containing precursor is about 0.0001 to about 10.

2. The method of claim 1, wherein the surfactant containing antimony is an antimony-containing precursor comprising stibine ($SbH_3$), antimony trichloride ($SbCl_3$), antimony tetrachloride ($SbCl_4$), antimony pentachloride ($SbCl_5$), triphenylantimony (($C_6H_5$)$_3$Sb), antimony trihydide ($SbH_3$), antimonytrioxide ($Sb_2O_3$), antimony pentoxide ($Sb_2O_5$), antimony trifluoride ($SbF_3$), antimony tribromide ($SbBr_3$), antimonytriiodide ($SbI_3$), antimony pentafluoride ($SbF_5$), Triethyl antimony (TESb), or trimethyl antimony (TMSb).

3. The method of claim 1, wherein the group IV-containing precursor is a silicon-containing precursor comprising silanes, halogenated silanes, organosilanes, or combinations thereof.

4. A method of processing a substrate in a processing chamber, comprising:
forming one or more trenches in a substrate to define fin structures extending from a surface of the substrate;
filling the one or more trenches with an insulator material; and
growing an epitaxial film over sidewalls of each fin structure, wherein the epitaxial film has {100} planes, {110} planes, and {111} planes, by exposing the substrate to a group IV-containing precursor and a surfactant comprising a group V-containing precursor, wherein the surfactant is introduced into the processing chamber before epitaxial growth of the epitaxial film such that growth rate of the epitaxial film on {111} planes is faster than growth rate of the epitaxial film on {100} planes.

5. The method of claim 4, wherein the surfactant is an antimony-containing precursor.

6. The method of claim 5, wherein the antimony-containing precursor comprises stibine ($SbH_3$), antimony trichloride ($SbCl_3$), antimony tetrachloride ($SbCl_4$), antimony pentachloride ($SbCl_5$), triphenylantimony (($C_6H_5$)$_3$Sb), antimony trihydide ($SbH_3$), antimonytrioxide ($Sb_2O_3$), antimony pentoxide ($Sb_2O_5$), antimony trifluoride ($SbF_3$), antimony tribromide ($SbBr_3$), antimonytriiodide ($SbI_3$), antimony pentafluoride ($SbF_5$), Triethyl antimony (TESb), or trimethyl antimony (TMSb).

7. The method of claim 4, wherein the epitaxial film comprises doped or undoped group IV-containing material.

8. The method of claim 7, wherein the epitaxial film comprises silicon.

9. The method of claim 7, wherein the epitaxial film comprises silicon germanium.

10. The method of claim 4, wherein the epitaxial film is a silicon antimony alloy.

11. The method of claim 4, wherein the growth rate difference between {111} planes and {100} planes is 50% or more.

12. The method of claim 4, wherein the substrate is a crystalline silicon, strained silicon, germanium, silicon germanium, silicon germanium carbide, a silicon germanium oxide (SiGeO) substrate, a silicon germanium oxynitride (SiGeON) substrate, a silicon carbide (SiC) substrate, a silicon carbonitride (SiCN) substrate, a silicon carbonoxide (SiCO), an epi substrate, a silicon-on-insulator (SOI) substrate, a carbon doped oxide, or a silicon nitride.

13. The method of claim 4, wherein the substrate is a monocrystalline silicon substrate.

14. The method of claim 4, wherein the group IV-containing precursor is a silicon-containing precursor comprising silane ($SiH_4$), disilane ($Si_2H_6$), trisilane ($Si_3H_8$), tetrasilane ($Si_4H_{10}$), a polychlorosilane silane, an halogenated silane, an organosilane, or combinations thereof.

15. The method of claim 14, wherein the halogenated silane is hexachlorodisilane ($Si_2Cl_6$), tetrachlorosilane ($SiCl_4$), dichlorosilane ($Cl_2SiH_2$) or trichlorosilane ($Cl_3SiH$).

16. The method of claim 4, wherein the exposing the substrate to a group IV-containing precursor and a surfactant comprises:
introducing a single pulse of the surfactant into the processing chamber before the introduction of the group IV-containing precursor.

17. The method of claim 4, wherein the exposing the substrate to a group IV-containing precursor and a surfactant comprises:
introducing a single pulse of the surfactant into the processing chamber before introduction of the group IV-containing precursor;
introducing the group IV-containing precursor into the processing chamber; and
while flowing the silicon-containing precursor into the processing chamber, introducing multiple pulses of the surfactant into the processing chamber at predetermined time intervals.

18. A method of processing a substrate in a processing chamber, comprising:
forming one or more trenches in a substrate to define fin structures extending from a surface of the substrate;
filling the one or more trenches with an insulator material; and
growing an epitaxial film over sidewalls of each fin structure, wherein the epitaxial film has {100} planes, {110} planes, and {111} planes, by exposing the substrate to a group IV-containing precursor and a surfactant comprising a group V-containing precursor, wherein exposing the substrate to a group IV-containing precursor and a surfactant comprising:
introducing a single pulse of the surfactant into the processing chamber before introduction of the group IV-containing precursor, wherein the surfactant is introduced into the processing chamber before epitaxial growth of the epitaxial film such that growth rate of the epitaxial film on {111} planes is faster than growth rate of the epitaxial film on {100} planes; and
while flowing the surfactant, introducing the group IV-containing precursor into the processing chamber.

19. The method of claim 18, wherein a molar ratio of the surfactant to the group IV-containing precursor is about 0.0001 to about 10.

* * * * *

UNITED STATES PATENT AND TRADEMARK OFFICE
CERTIFICATE OF CORRECTION

PATENT NO. : 10,205,002 B2
APPLICATION NO. : 15/418128
DATED : February 12, 2019
INVENTOR(S) : Xinyu Bao et al.

Page 1 of 1

It is certified that error appears in the above-identified patent and that said Letters Patent is hereby corrected as shown below:

In the Specification

In Column 3, Line 51, delete "silicon carbonoxide" and insert -- silicon carboxide --, therefor.

In Column 4, Line 43, delete "layer" and insert -- layer. --, therefor.

In Column 5, Lines 57-58, delete "trihydide" and insert -- trihydride --, therefor.

In Column 7, Line 48, delete "hexachloro-digermane" and insert -- hexachlorodigermane --, therefor.

In the Claims

In Column 8, Lines 23-24, in Claim 2, delete "trihydide" and insert -- trihydride --, therefor.

In Column 8, Line 55, in Claim 6, delete "trihydide" and insert -- trihydride --, therefor.

In Column 9, Line 9, in Claim 12, delete "silicon carbonoxide" and insert -- silicon carboxide --, therefor.

In Column 9, Line 17, in Claim 14, delete "polychlorosilane silane," and insert -- polychlorosilane, --, therefor.

Signed and Sealed this
Ninth Day of April, 2019

Andrei Iancu
*Director of the United States Patent and Trademark Office*